United States Patent [19]
Maeda

[11] Patent Number: 5,804,871
[45] Date of Patent: Sep. 8, 1998

[54] LEAD ON CHIP SEMICONDUCTOR DEVICE HAVING BUS BARS AND CROSSING LEADS

[75] Inventor: Takayuki Maeda, Kukizaki-machi, Japan

[73] Assignee: Texas Instruments Incorporated, Dallas, Tex.

[21] Appl. No.: 838,471

[22] Filed: Apr. 7, 1997

Related U.S. Application Data

[60] Continuation of Ser. No. 703,437, Aug. 27, 1996, abandoned, which is a division of Ser. No. 324,330, Oct. 17, 1994, Pat. No. 5,550,401.

[30] Foreign Application Priority Data

Feb. 7, 1992 [JP] Japan .................................. 4-057066

[51] Int. Cl.$^6$ ................................................ H01L 23/495
[52] U.S. Cl. ........................... 257/666; 257/676; 257/776
[58] Field of Search ..................... 257/666, 676, 257/786, 777

[56] References Cited

U.S. PATENT DOCUMENTS

| | | | |
|---|---|---|---|
| 5,442,233 | 8/1995 | Anjoh et al. ............................. | 257/666 |
| 5,545,920 | 8/1996 | Russell ..................................... | 257/666 |
| 5,563,443 | 10/1996 | Beng et al. .............................. | 257/666 |

FOREIGN PATENT DOCUMENTS

| | | |
|---|---|---|
| A-0 272 187 | 6/1988 | European Pat. Off. . |
| A-0 409 173 | 1/1991 | European Pat. Off. . |
| A-0 425 775 | 5/1991 | European Pat. Off. . |

OTHER PUBLICATIONS

Patent Abstracts of Japan, vol. 016, No. 045(E-1162), Yaguchi Akihiro, et al., Feb. 1992.

*Primary Examiner*—Carl W. Whitehead
*Assistant Examiner*—S. V. Clark
*Attorney, Agent, or Firm*—Richard L. Donaldson; William B. Kempler

[57] ABSTRACT

Along the column of bonding pad (1), bidding terminal portions (2c), (3c), (4a), (5a) of bus bars (2), (3), and signal lines (4), (5) are arranged; principal wiring portions (2a), (3a) are made to extend in a 3-dimensional crossing configuration with respect to the signal lines, and they are connected to the bonding terminal portion of the bus bars, forming the IC package of the LOC type. Between the various bonding terminal portions and the various bonding pads, there exists no main wiring portion of the bus bar. Consequently, bonding wires (6), (7), (8), (9) do not straddle the bus bar principal wiring portion. As a result, when the bonding wire is not elevated, the bonding wire still does not make contact with the bus bar principal wiring portion to cause short circuit; as a result, the reliability is high and the device becomes thinner.

5 Claims, 4 Drawing Sheets

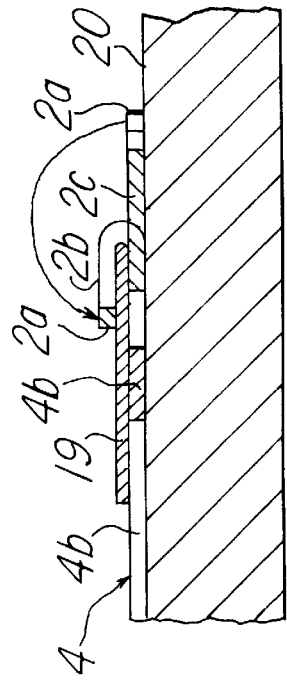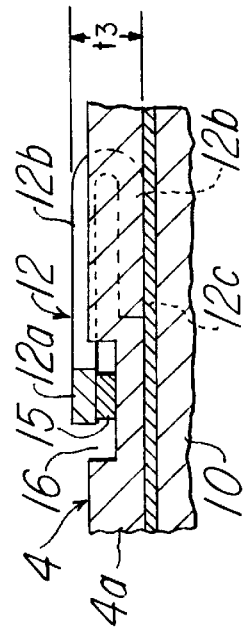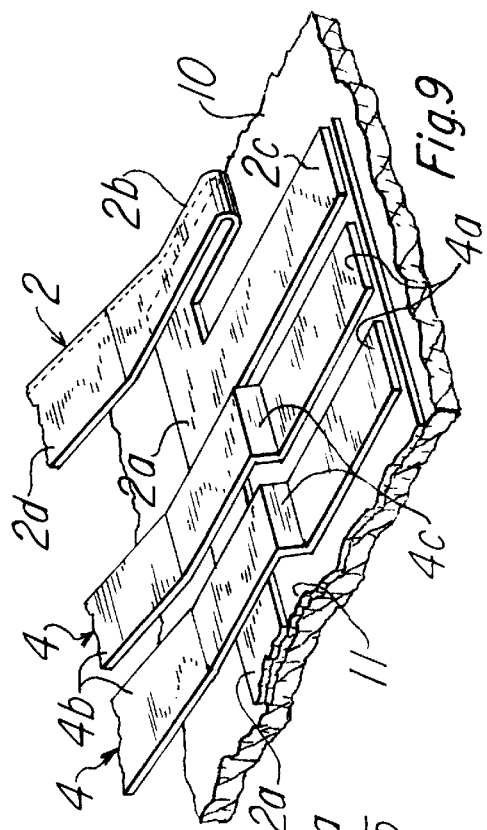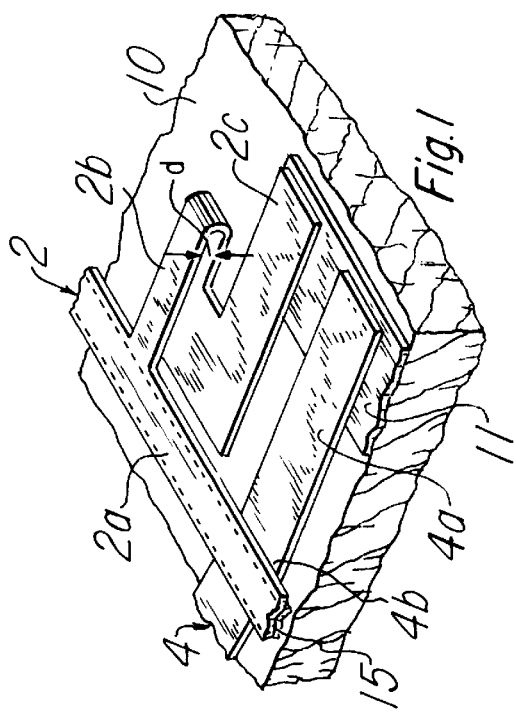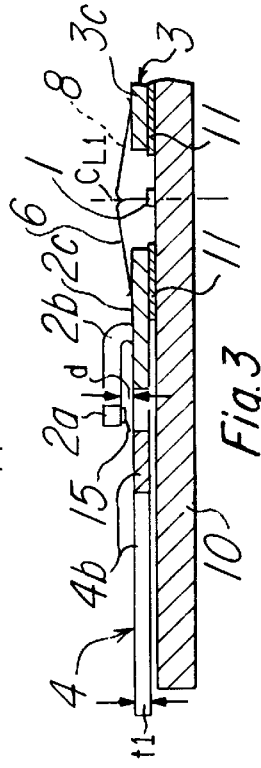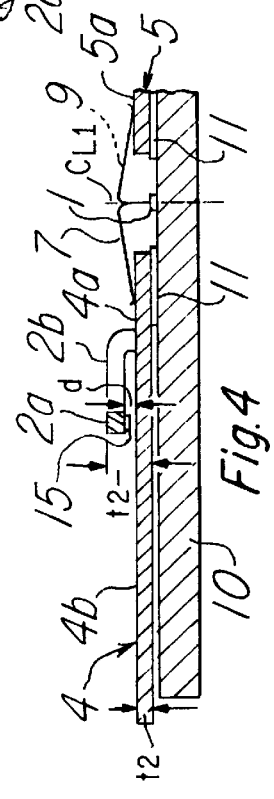

LEAD ON CHIP SEMICONDUCTOR DEVICE HAVING BUS BARS AND CROSSING LEADS

This application is a Continuation of application Ser. No. 08/703,437, filed Aug. 27, 1996, now abandoned, which is a division of application Ser. No. 08/324,330, filed Oct. 17, 1994, now U.S. Pat. No. 5,550,401.

FIELD OF THE INVENTION

This invention concerns a type of semiconductor device. In particular, this invention concerns a package with the LOC (Lead On Chip) structure.

BACKGROUND OF THE INVENTION

In the prior art, there is the LOC configuration with a lead frame set on the IC chip as a package for sealing the IC chip. This can be explained with reference to FIGS. 10 and 11.

As shown in FIG. 10, the LOC-structure DRAM (dynamic RAM) has multiple bonding pads 1 set on a straight line at the central portion of IC chip 10. On the two sides of the pad column are power-source lines 42, 43, known as bus bars, that form the lead frame for LOC and are made of iron-nickel alloy, copper alloy or copper, as well as multiple signal lines (lead frame) 44, 45.

Bus bars 42, 43 are connected to power source Vss or Vcc. On the other hand, signal lines 44, 45 are used for addresses A0 through A10 as well as CAS, RAS or other signals.

Connection between each pad 1 and each line is performed by means of bonding wires 6, 7 on one side (the left side) of the bonding-pad column; it is performed by means of bonding wires 8, 9 on the other side (the right side). As shown explicitly in FIG. 11, wires 7, 9, which connect signal lines 44, 45 to pad 1 stride over bus bars 42, 43, respectively.

Consequently, when wires 7 and 9 are not sufficiently high, they may be in contact with bus bars 42, 43, and there is the danger that a short-circuit will formed between the signal lines and the bus bars. In order to prevent this problem, the height of wires 7, 9 must be sufficiently large. This, however, hampers the effort to reduce the thickness of the resin-mold package.

As shown in FIG. 12, on IC chip 10, bonding pads BP are set in one column on each of the left and right sides. On the two sides of each pad column, signal lines 3A1 and bus bars 3A2 are set. Connection by bonding wire W is performed for each pad column by means of signal lines on one side and by means of bus bars on the other side. Consequently, the wires no longer stride the bus bars as described in the above, and the short-circuit between the signal lines and the bus bars can be entirely avoided for this lead frame.

However, for the package shown in FIG. 12, signal lines 3A1 can be set only on one side with respect to a pad column; hence, the efficiency is poor, and the layout is also limited. In addition, as the pin number is increased, the pitch distance among the signal lines becomes smaller, and there is little tolerance.

An object of this invention is to provide a type of package-structure semiconductor device, characterized by the fact that the short-circuit between the signal lines and bus bars can be prevented, the thickness of the package can be reduced, and the signal lines can be set easily, with the connection made at a high efficiency.

SUMMARY OF THE INVENTION

This invention provides a type of semiconductor device, characterized by the following facts:

the multiple bonding pads connected to the bonding-terminal portion of the lead frame are set in a nearly columnar shape on the circuit-forming plane of the semiconductor chip;

the aforementioned bonding-terminal portion for the multiple signal lines of the lead frame and the bonding-terminal portion for the multiple power-source lines are bonded via an electrical insulator on the aforementioned semiconductor chip in the vicinity of and along the aforementioned bonding-pad column;

the principal portion of the aforementioned power-source line extends in a 3-dimensional crossed configuration for electrical insulation from the aforementioned signal line;

the aforementioned principal portion of the aforementioned power-source line and the bonding-terminal portion of the aforementioned power-source line are formed continuously in an integrated manner;

the aforementioned various bonding-terminal portions and the aforementioned bonding pads are electrically connected.

BRIEF DESCRIPTION OF THE DRAWINGS

FIG. 1 is an enlarged partial oblique view illustrating the main portion of the IC package with the LOC structure in an embodiment of this invention.

FIG. 3 is a cross-sectional view cut along line III—III in FIG. 2.

FIG. 4 is a cross-sectional view cut along line IV—IV in FIG. 2.

FIG. 6 is a cross-sectional view cut along line VI—VI in FIG. 5.

FIG. 7 is an enlarged partial cross-sectional view illustrating a modified example on the base of the example shown in FIGS. 1–6.

FIG. 9 is an enlarged partial oblique view illustrating the main portion of the IC package with the LOC structure in yet another embodiment of this invention.

Figure 2:
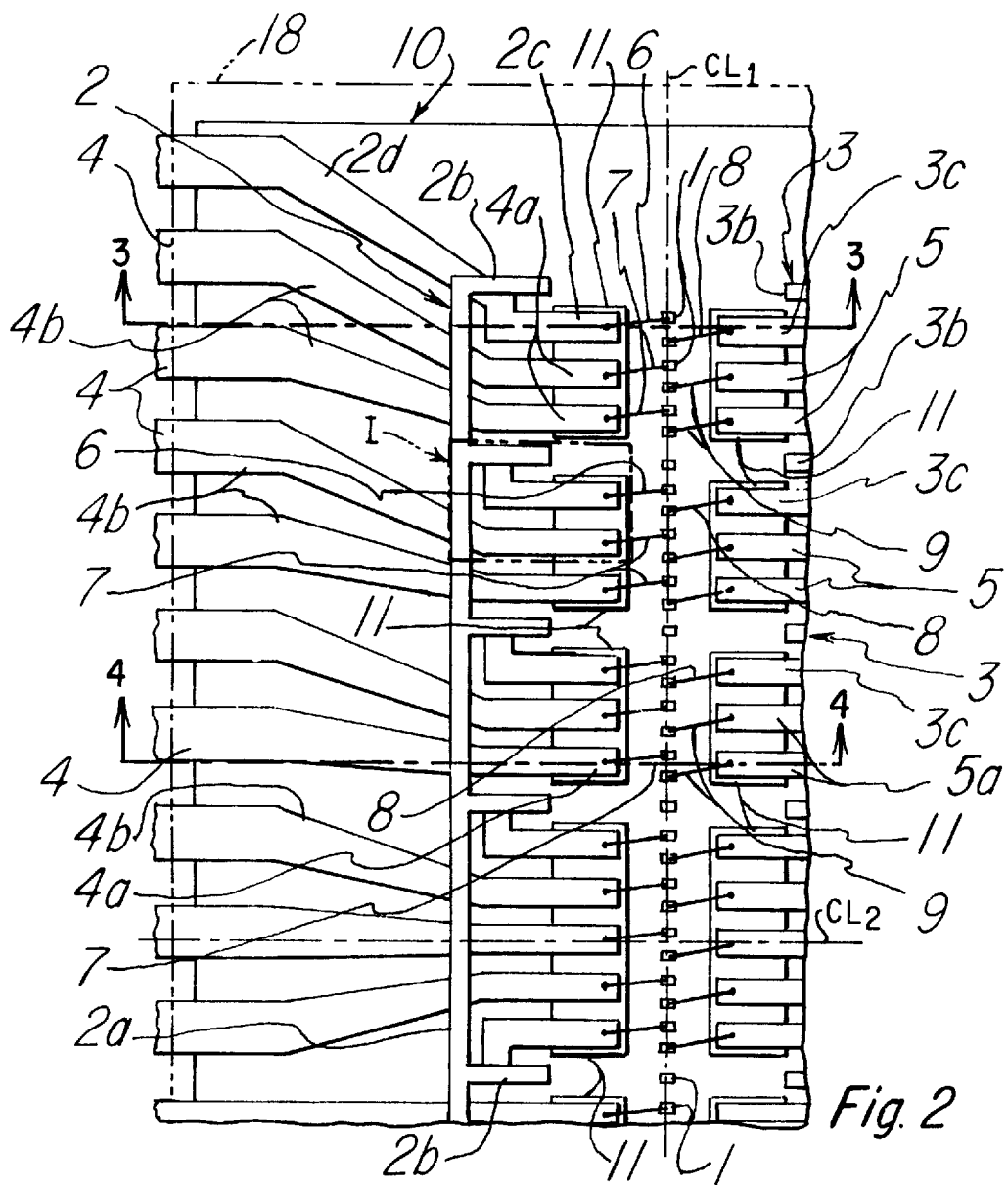
FIG. 2 is a plan view illustrating the aforementioned main portion.

In reference numerals as shown in the drawings:
1, bonding pad
2, 3, 12, 22, 23, 32, 33, bus bar (power source line)
2a, 3a, 12a, 22a, 23a, 32a, 33a, principal wiring portion
2b, 3b, 12b, 22b, 23b, 32b, 33b, branched portion
2c, 3c, 4a, 5a, 12c, 22c, 23c, 24a, 25a, 32c, 33c, bonding terminal portion
2d, 3d, 4b, 5b, 22d, 23d, 24b, 25b, 32d, 33d, lead portion
4, 5, 24, 25, signal line
4c, step portion 6, 7, 8, 9, bonding wire
10, IC chip
11, insulating double-side tape
15, insulating tape or insulating paste
16, groove of signal line
19, fixture for folding
26, bump electrode
$CL_1$, $CL_2$, central line

DESCRIPTION OF THE PREFERRED EMBODIMENTS

In the following, this invention will be explained in more detail with reference to embodiments thereof.

FIGS. 1–6 show a first embodiment of this invention, applied to DRAM.

The package in this embodiment has the LOC configuration explained above. As shown in FIG. 2, multiple bonding pads 1 are set in a column on a straight line. With the column of bonding pad 1 taken as central line $CL_1$, the configuration shown in the figure is symmetric for the right and left sides, with bus bar 2 (for Vss) set on the left side, and with bus bar 3 (for Vcc) set on the right side. Bus bar 2 (the same for bus bar 3) consists of a straight-line shaped wiring portion 2a, branched portion 2b (3b), bonding-terminal portion 2C (3C), and lead portion 2d, which is connected to the end of the bonding terminal and is lead outside the IC package.

Using insulating double-sided tape 11, bonding-terminal portion 2C of bus bar 2 and bonding terminal 4a of signal line 4 are bonded on the upper surface of IC chip 10. In this figure, 4b represents the lead portion of signal line 4 to the outside of the IC chip. The same state also exists for bus bar 3 and signal line 5 on the side of bus bar 3. For the IC package, the configuration is symmetric for the upper and lower sides with reference to $CL_2$ as the center line. Broken line 12 on the periphery represents the resin-sealing area in case of molding.

The bonding operation between the bus bars and signal lines is performed as follows. Bonding-terminal portion 2C of bus bar 2 and bonding terminal 4a of signal line 4 are connected to bonding pad 1 via bonding wires 6, 7. Similarly, bonding-terminal portion 3C of bus bar 3 and bonding-terminal portion 5a of signal line 5 are connected to bonding pad 1 by means of bonding wires 8, 9, respectively.

Bonding wires 6 and 7 as well 8 and 9, are set on either the left or right side of center line $CL_1$. As shown in FIG. 3, the cross-sectional view cut along line III—III in FIG. 2, and FIG. 4, the cross-sectional view cut along line IV—IV in FIG. 2, all of the wires do not stride the wiring as bonding pad 1 is connected to bonding-terminal portion 2C, 4a, 3C, or 5a. Consequently, there is no need to increase the height of wires 6, 7, 8, and 9, and there is no danger of a short-circuit.

In this example, attention should be given to the shape of the bus bar. As can be seen from FIG. 2, the enlarged oblique view of area I defined by the broken line is shown in FIG. 1, where branch portion 2b of bus bar 2 is mechanically bent by 180° from the upper side to the left, and the upper and lower portions are overlapped with distance d between them.

The thickness $t_1$ of bus bar 2 and signal line 4 of the lead frame for the LOC is 5 mil or 8 mil. When $t_1$ is 5 mil, distance d is 3 mil; when $t_1$ is 8 mil, distance d becomes [not given in original]. Here, 1 mil represents 25.4 μm. Consequently, principal wiring portion 2a of bus bar 2 is arranged at the distance d without contacting signal line 4. The thickness of the principal wiring portion of bus bar 2a, and the sum of the thickness $t_2$ of distance d and signal line 4, becomes 13 mil when $t_1$ is 5 mil.

Figure 11:
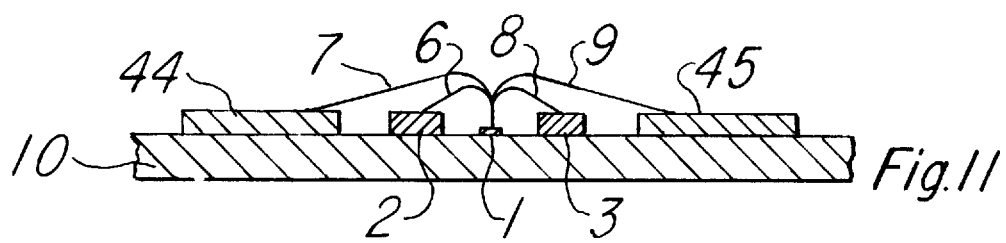
FIG. 11 is a cross-sectional view cut along X—XI line in FIG. 10.

In the prior art shown in FIG. 11, the loop apex of bonding wires 7, 9 for the signal equipment and striding for the bus bar has a height of 24 mil from the circuit-forming surface of the IC chip. On the other hand, in this invention, as pointed out in the above, when the thickness of the lead frame sheet is 5 mil, and the thickness of the insulating double-sided tape 11 is 3 mil, the height of the apex of the bus bar from the circuit-forming surface of the IC chip becomes 16 mil. That is, the thickness of the resin-mold package can be significantly reduced.

As shown in FIGS. 1, 3, and 4, in order to reliably prevent the contact of bus bar 2a with signal-line lead portion 4b, the lower surface of principal wiring portion of bus bar 2a is bonded with an insulating tape or insulating paste 15. Distance d, the gap between principal wiring portion 2a and IC chip 10, the gap between bonding-terminal portions 2c, 4a and IC chip 10, and other gaps are filled with the sealing resin in the latter molding operation. The same operation as above is performed for bus bar 3 as well.

Figure 5:
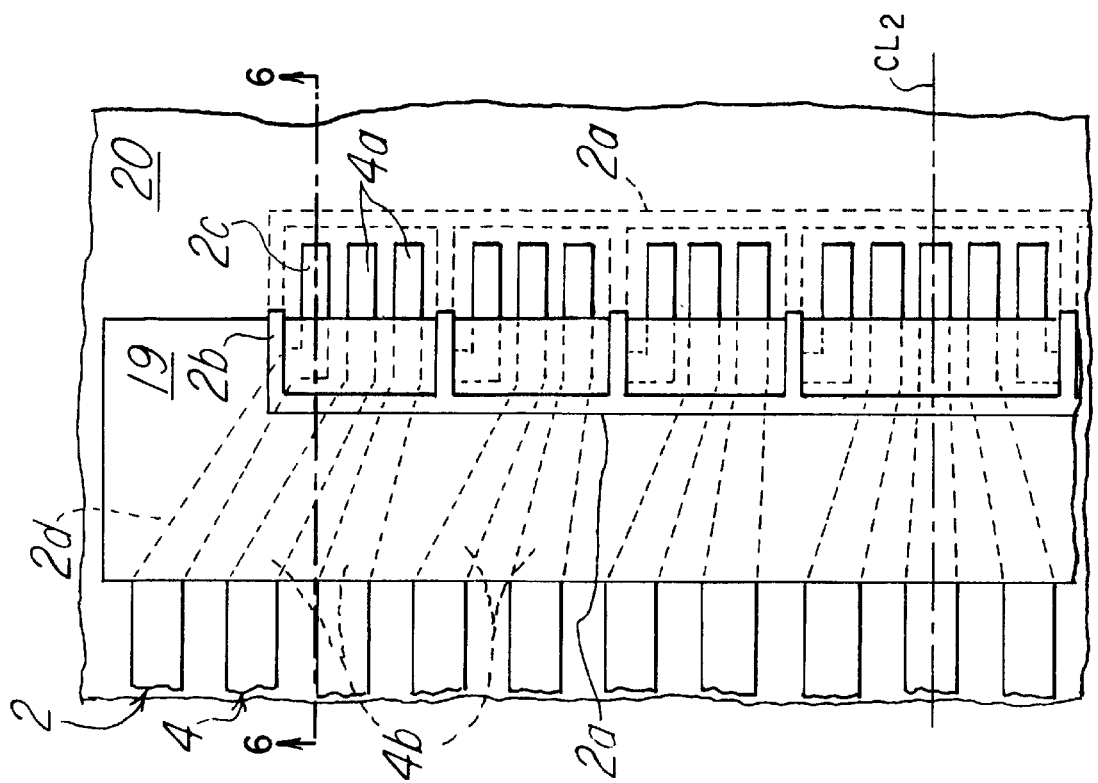
FIG. 5 is a plan view of the main portion in the state before the bus bar is folded in the embodiment illustrated in FIGS. 1–4.
Figure 12:
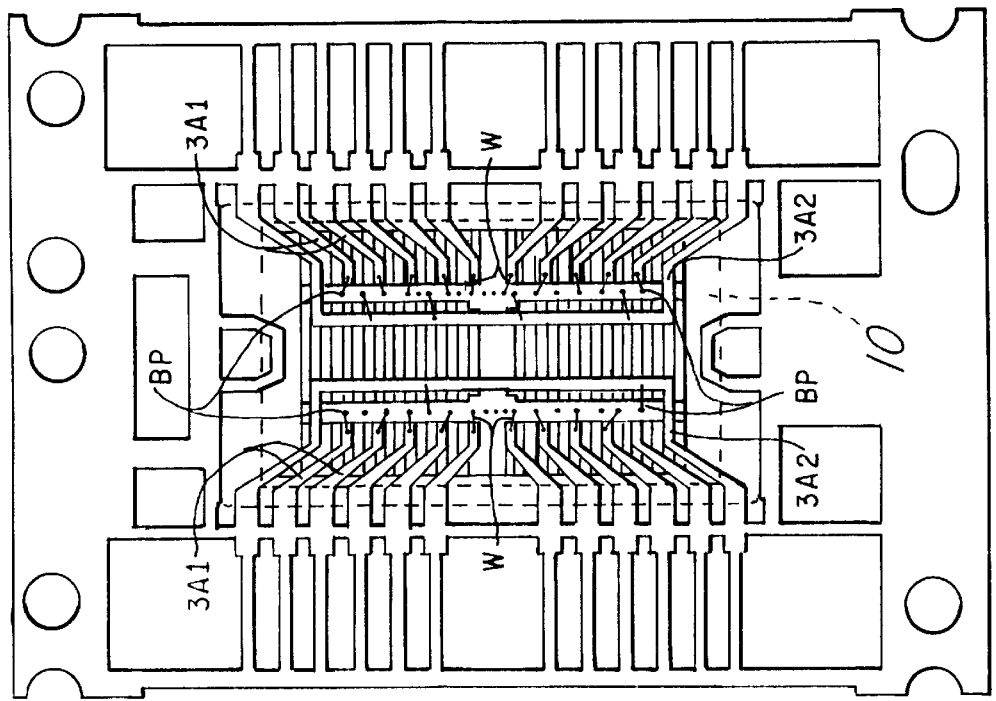
FIG. 12 is a plan view illustrating a portion of the lead frame with the LOC structure in another conventional example.
Figure 10:
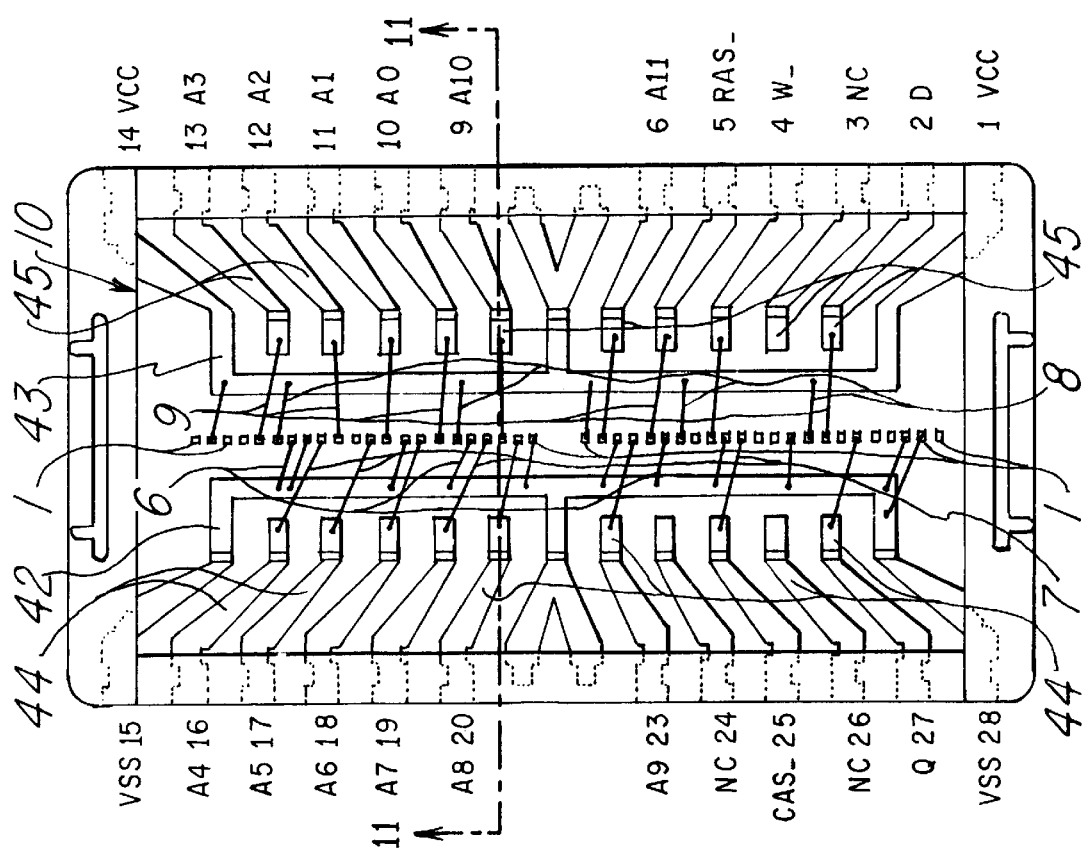
FIG. 10 is a plan view illustrating the main portion of the IC package with the LOC structure in a conventional example.

The bending of branch portion 2b of bus bar 2 is performed as shown in FIG. 5.

The lead frame formed into a flat plate shape with a prescribed pattern is arranged on base (20) as shown in FIG. 5 and FIG. 6, the cross-sectional view cut along VI—VI line in FIG. 5. Then, a plate-shaped fixture (19) with its cross-section finished to semicircular profile on one side is arranged with the aforementioned side in agreement with the bus bar bending position, and it is used to fix lead portions (2d), (4b) of bus bar (2) and signal line (4). In the figure, the portion of the bus bar before bending is represented by a broken line.

Then, with fixture (19) arranged to fix bus bar (2) and signal line (4) on base (20), branched portion (2b) and principal wiring portion (2a) are bent by 180° as indicated by the arrow so that they come into contact with the upper surface of fixture (19). In this way, bus bar (2) assumes the shape represented by the solid line.

As shown in FIGS. 1–4, the lead frame processed by the aforementioned method has its bonding terminal portions (2c), (4a) bonded on the upper surface of IC chip (10) by means of insulating double-side tape (11). Before the bonding operation, an insulating tape or insulating paste (15) is applied to bus bar principal wiring portion (2a). For bus bar (3), too, the same molding operation is performed as above. The processing of the bus bar does not require welding or other special techniques. Since it can be performed by using a simple fixture, a low cost is realized.

FIG. 7 is a cross-sectional view of the enlarged portion of the example with a smaller $t_2$ dimension in FIG. 3 in the same way as in FIG. 4. FIG. 7 has a larger enlargement rate than FIG. 4.

In this example, suppose the plate used for the LOC lead frame has a thickness of 5 mil, for the bus bar portion, bus bars (2a), (2b), (2c) used in the aforementioned example are made thinner than the other portions by partial etching beforehand, and, with a thickness of 3 mil, are used as bus bar (12). For a portion of signal line (4), pre-etching is performed to form a groove (16), a portion of bus bar branched portion (12b) is bent so that principal wiring portion (12a) is located on groove (16). Then, a portion of the lower side of principal wiring portion (12a) and the insulating tape or insulating paste (15) bonded with it are made to enter groove (16), and the insulating tape or insulating paste (15) comes into contact with the bottom surface of groove (16).

In this way, dimension $t_3$ between the upper surface of bus bar principal wiring portion (12a) and the lower surface of signal line (4) becomes 9 mil, smaller than dimension $t_2$ in the preceding example.

Figure 8:
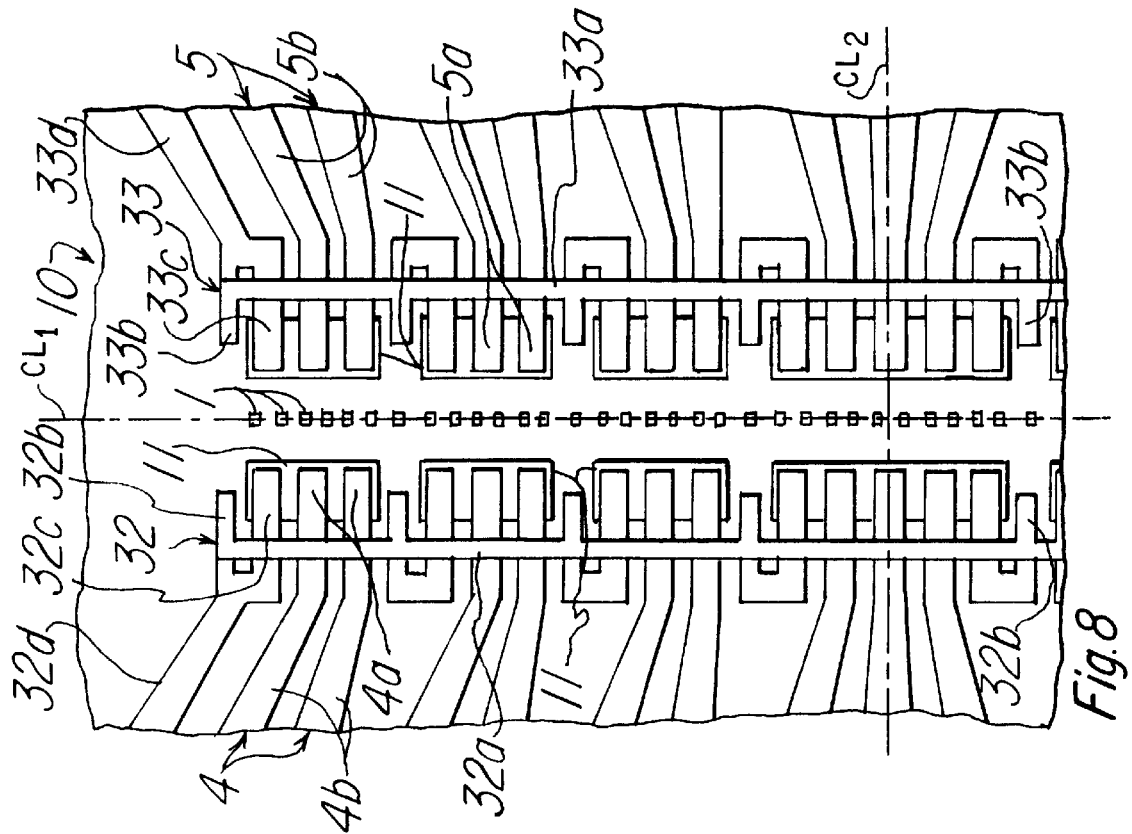
FIG. 8 is a partial plan view illustrating the main portion of the IC package with the LOC structure in another embodiment of this invention.

FIG. 8 illustrates another embodiment as a modification of the example shown in FIGS. 1–6.

In this example, branched portions (32b), (33b) of bus bars (32), (33) are shorter than branched portion (2b) shown in FIG. 2. Principal wiring portions (32a), (33a) are rather located nearer the side of bonding pad (1) than located on the plane curving portion of signal line (4), (5). In this way, the stability of principal wiring portions (32a), (33a) before sealing using resin is higher than that in the example shown in FIG. 2. In this figure, (5b), (32d), and (33d) represent the lead portions. Other features are identical to those in FIGS. 1–6.

FIG. 9 shows another application example with further modification made on the example shown in FIGS. 1–6.

In this example, principal wiring portion (2a) of bus bar (2) is bonded on IC chip (10) by means of an insulating double-side tape (11), and the portion in contact with bonding terminal portion (4a) of lead portion (4b) of signal line (4) is bent at two locations to arrange a step portion (4c). Lead portion (4b) is arranged on bus bar principal wiring portion (2a) with no electrical contact with it. In order to prevent this contact, it is preferred that an insulating tape or insulating paste be inserted.

In this way, the bus bar and the signal line lead portions (2d), (4b) are located at the same height with respect to IC chip (10). Consequently, when the package is sealed by resin and molded, no difference is formed for the level for leading out from the package. This is identical to the aforementioned examples. Others are identical to those in the examples shown in FIGS. 1–6.

For bus bar branched portion (2b), instead of bending for 180°, lead portion (2d) is arranged extending to the upper-right side from principal wiring portion (2a), and a same step portion as that of step portion (4c) of the signal line is placed in lead portion (2d). Also, the step portion may be not formed at lead portion (2d), instead, adjustment is made for dimension $t_2$ in FIG. 4 or dimension $t_3$ in FIG. 7 by selecting the radius of curvature of bending.

In the above, this invention was explained with reference to respective embodiments. However, other modified versions are also allowed as long as the technical ideas of this invention are observed.

For example, the package of this invention is not limited to the DRAM (16 mega [sic; megabit], 64 mega etc), it may also be used in various other devices.

In the semiconductor device of this invention, the bonding terminal portion of the power source line and the bonding terminal portion of the signal line are arranged along the column of the bonding pad; the principal portion of the aforementioned power source line extends with a 3-dimensional crossing configuration with respect to the aforementioned signal line with electrical insulation, and it is connected to the bonding terminal portion of the aforementioned power source line; consequently, between the aforementioned bonding terminal portion and the aforementioned bonding pad, there exists only the bonding wiring used to connect them.

Consequently, even when the aforementioned bonding wire loop used for connection is not elevated, the bonding wire is still not in contact with the power source line principal portion, and hence no short circuit takes place. As a result, the reliability is high, and the device can be made thin.

I claim:

1. A semiconductor device comprising:
    a semiconductor substrate having a surface on which an electronic circuit is provided;
    a plurality of bonding pads disposed on the surface of said semiconductor substrate at a substantially central location thereon and arranged in a straight line column;
    first and second bus bars on the surface of said semiconductor substrate and respectively disposed on opposite sides of said column of bonding pads;
    first and second pluralities of elongated leads on the surface of said semiconductor substrate and respectively disposed on opposite sides of said column of bonding pads;
    each of said bus bars including:
        a base wiring portion extending in a straight line in spaced parallel relation to said column of bonding pads,
        a plurality of branch portions integral with and extending inwardly from said base wiring portion toward said column of bonding pads, said plurality of branch portions being in substantially perpendicular relation thereto to said base wiring portion, and
        a plurality of bonding terminal portions integral with and corresponding to said plurality of branch portions, each of said bonding terminal portions having a wire bonding terminal extending inwardly from said base wiring portion toward said column of bonding pads and in offset relation to the branch portion corresponding thereto;
    the leads of each of said first and second pluralities of elongated leads extending across the base wiring portion of the bus bar corresponding thereto and including inner lead portions arranged in spaced coextensive relation to said wire bonding terminals of the bonding terminal portions of said first and second bus bars;
    said wire bonding terminals of the bonding terminal portions of said first and second bus bars and said inner lead portions of said first and second pluralities of elongated leads being arranged along said column of bonding pads on opposite sides thereof;
    a first group of individual connector wires connected to respective ones of said bonding pads at one end and to respective wire bonding terminals of the bonding terminal portions of said first and second bus bars at the other end thereof; and
    a second group of individual connector wires connected to respective others of said bonding pads at one end and to respective inner lead portions of said first and second pluralities of elongated leads at the other end thereof.

2. A semiconductor device as set forth in claim 1, further including means interposed between the crossing leads of each of said first and second pluralities of elongated leads and the base wiring portion of the bus bar corresponding thereto for electrically insulating said leads from said base wiring portion.

3. A semiconductor device as set forth in claim 2, wherein said insulation means comprises an insulating tape applied to the respective base wiring portions of said first and second bus bars on the surface thereof proximate to the crossing leads of said first and second pluralities of elongated leads.

4. A semiconductor device as set forth in claim 2, wherein the leads of said first and second pluralities of elongated leads extend over the respective base wiring portion of the first and second bus bars corresponding thereto.

5. A semiconductor device as set forth in claim 1, wherein said first and second pluralities of elongated leads respectively include outer lead portions extending outwardly from said semiconductor substrate and being disposed at substantially the same level with respect to the surface of said semiconductor substrate on which said electronic circuit is provided.

* * * * *